United States Patent

Wang et al.

[11] Patent Number: 6,130,853
[45] Date of Patent: Oct. 10, 2000

[54] ADDRESS DECODING SCHEME FOR DDR MEMORY

[75] Inventors: Ming-Hung Wang; Gyh-Bin Wang; Chun Shiah, all of Hsinchu, Taiwan

[73] Assignee: Etron Technology, Inc., Hsin-Chu, Taiwan

[21] Appl. No.: 09/050,216

[22] Filed: Mar. 30, 1998

[51] Int. Cl.[7] .................................................. G11C 8/00
[52] U.S. Cl. .............. 365/230.06; 365/200; 365/230.04; 365/233; 365/236
[58] Field of Search ............................... 365/230.06, 200, 365/233, 230.04, 193, 236

[56] References Cited

U.S. PATENT DOCUMENTS

| | | | |
|---|---|---|---|
| 5,610,874 | 3/1997 | Park et al. ............................... | 365/236 |
| 5,629,903 | 5/1997 | Agata ...................................... | 365/233 |
| 5,663,924 | 9/1997 | Barth, Jr. et al. .................. | 365/230.03 |
| 5,920,519 | 7/1999 | Jang ............................... | 365/230.06 X |

*Primary Examiner*—Do Hyun Yoo
*Attorney, Agent, or Firm*—George O. Saile; Stephen B. Ackerman

[57] ABSTRACT

Circuits and a method are disclosed for a semiconductor memory which decode from a system supplied input address two outputs which are either adjacent or boundary adjacent to each other. The two decoded outputs derived from the input address select then, in one cycle, two locations in a Double Data Rate Synchronous Dynamic Random Access Memory (DDR SDRAM). The circuits producing the two decoded outputs allow for sequential and interleaved mode, for data bursts of various lengths, and for addressing of redundant columns.

16 Claims, 11 Drawing Sheets

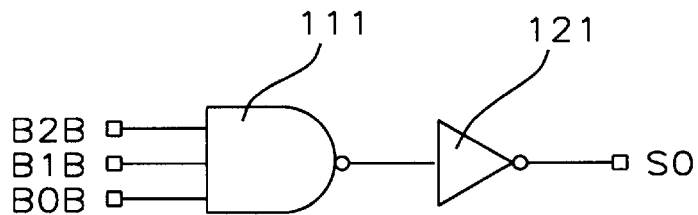
*FIG. 1a - Prior Art*
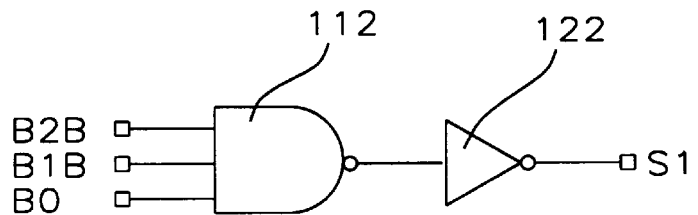
*FIG. 1b - Prior Art*
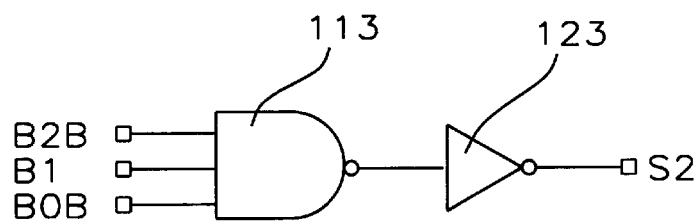
*FIG. 1c - Prior Art*
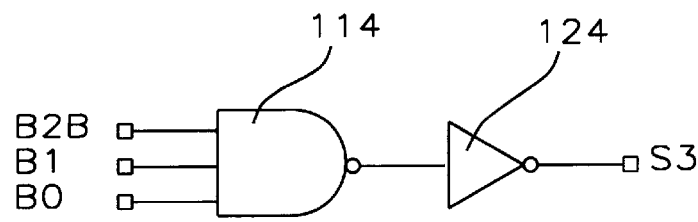
*FIG. 1d - Prior Art*

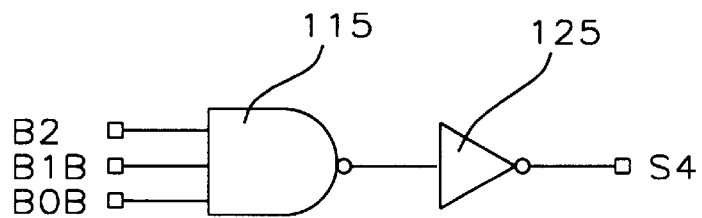
*FIG. 1e - Prior Art*
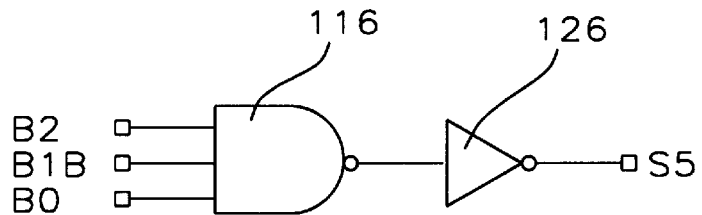
*FIG. 1f - Prior Art*
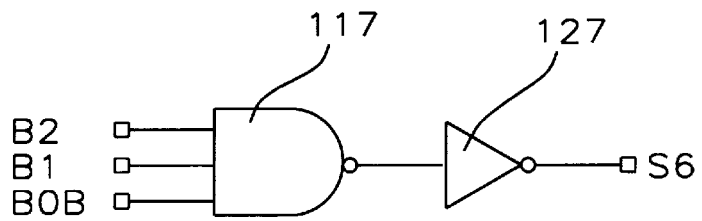
*FIG. 1g - Prior Art*
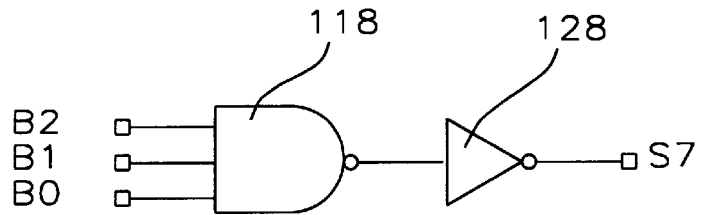
*FIG. 1h - Prior Art*

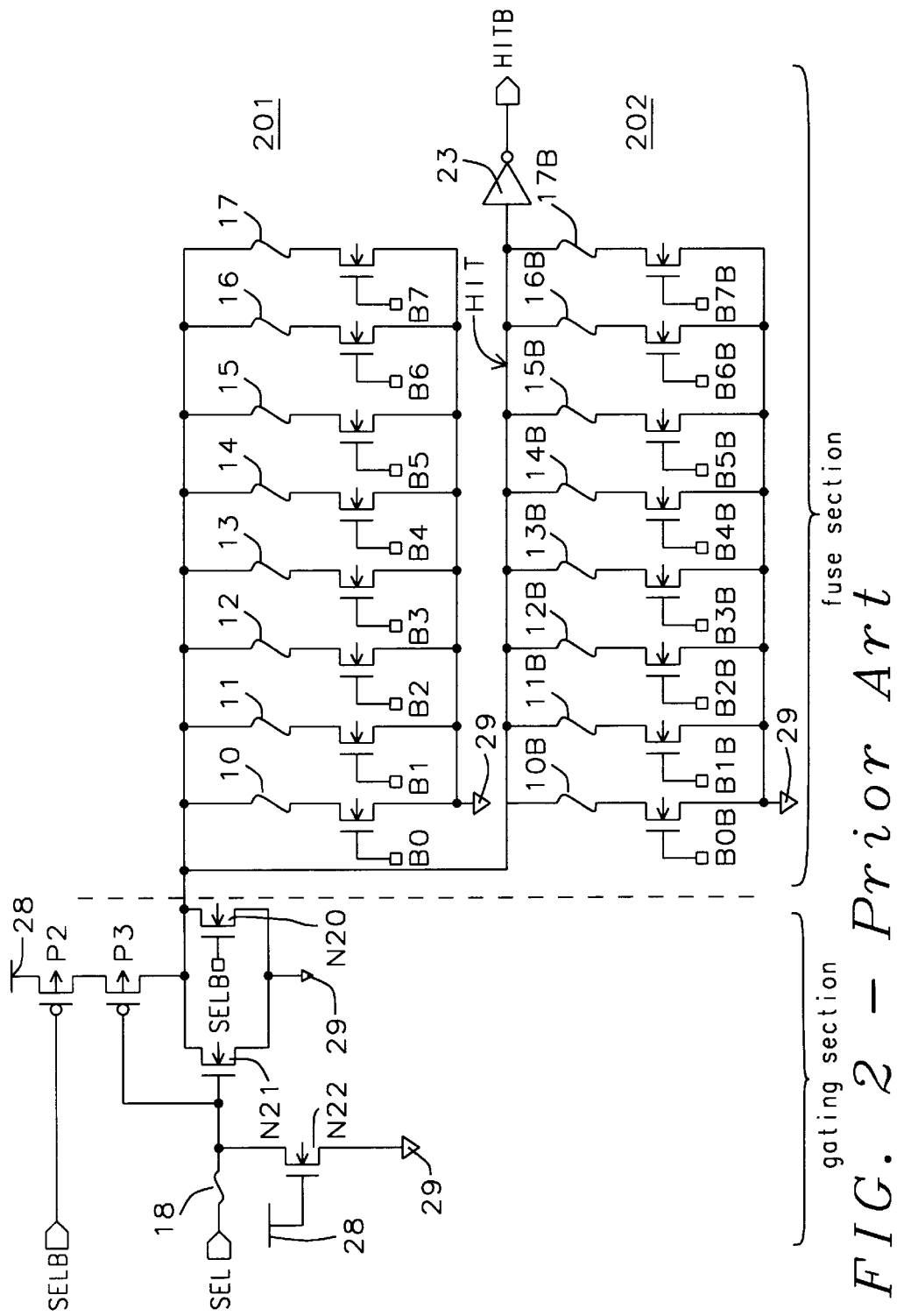
FIG. 2 – Prior Art

ADDRESS DECODING SCHEME FOR DDR MEMORY

BACKGROUND OF THE INVENTION

1. Field of the Invention

The invention relates generally to a Synchronous Dynamic Random Access Memory (SDRAM) and more particularly to a dual address decoding scheme for accessing two I/O locations in one cycle of a Double Data Rate (DDR) SDRAM.

2. Description of the Related Art

Semiconductor memories frequently access data in blocks, where the block length or burst is variable. The access to storage can be sequential or interleaved and affects the memory address sequence as shown in TABLE 1. For a traditional semiconductor memory the address supplied is a system responsibility. The supplied address typically is decoded by the memory to a single column or to a block address to read or write data into memory, e.g. a three bit address may provide a pre-decode of one of 8 columns from say S0 to S7. Such a simple decoding circuit for a three bit pre-decoder is shown in FIG. 1. To access redundant columns, provided in virtually all solid state memories to ensure an adequate yield in the manufacturing process, special addressing circuits are provided which consist of circuits with 'fuses' which can be blown to define and store the defective address in the fuse memory.

TABLE 1

| | | block addressing: | | |
|---|---|---|---|---|
| Burst Length | Starting Column Address | Order of Access within a Burst | | |
| | | | Type = Sequential | Type = Intervleaved |
| 2 | | A0 | | |
| | | 0 | 0-1 | 0-1 |
| | | 1 | 1-0 | 1-0 |
| 4 | A1 | A0 | | |
| | 0 | 0 | 0-1-2-3 | 0-1-2-3 |
| | 0 | 1 | 1-2-3-0 | 1-0-3-2 |
| | 1 | 0 | 2-3-0-1 | 2-3-0-1 |
| | 1 | 1 | 3-0-1-2 | 3-2-1-0 |
| 8 | A2 A1 | A0 | | |
| | 0 0 | 0 | 0-1-2-3-4-5-6-7 | 0-1-2-3-4-5-6-7 |
| | 0 0 | 1 | 1-2-3-4-5-6-7-0 | 1-0-3-2-5-4-7-6 |
| | 0 1 | 0 | 2-3-4-5-6-7-0-1 | 2-3-0-1-6-7-4-5 |
| | 0 1 | 1 | 3-4-5-6-7-0-1-2 | 3-2-1-0-7-6-5-4 |
| | 1 0 | 0 | 4-5-6-7-0-1-2-3 | 4-5-6-7-0-1-2-3 |
| | 1 0 | 1 | 5-6-7-0-1-2-3-4 | 5-4-7-6-1-0-3-2 |
| | 1 1 | 0 | 6-7-0-1-2-3-4-5 | 6-7-4-5-2-3-0-1 |
| | 1 1 | 1 | 7-0-1-2-3-4-5-6 | 7-6-5-4-3-2-1-0 |
| Full Page (256) | n = A0–A7 (location 0–255) | Cn, Cn + 1, Cn + 2 Cn + 3, Cn + 4 . . . . . . Cn − 1, (Cn + 256), Cn, (Cn + 257) . . . | | Not supported |

Such a circuit is shown in FIG. 2. The operating principle of this circuit is as follows. If the combination of fuse path and N-channel Metal Oxide Semiconductor (NMOS) devices, controlled by the input address, is no DC path from line HIT to ground, then the line HIT will be pulled up by the p-channel metal oxide semiconductor (PMOS) device and kept at high level. This state of the match circuit is defined as the 'active' state. The active state of the match circuit will enable one column redundancy. But if any direct current (DC) path exists (a combination of fuse path and NMOS device) in this match circuit, then the line HIT will be pulled down through this DC path and be kept at ground level. This state of the circuit is the 'inactive' state.

Referring again to FIG. 2, we now describe the match circuit in more detail. The circuit is made up of a gating and a fuse section. The gating section consists of p-channel transistors P2 and P3 and n-channel transistors N20, N21, and N22. Transistors P2 and P3 are connected in series between the positive power supply 28 and the drains of transistors N20 and N21. The sources of N20 and N21 are connected to the reference voltage 29. Input SELB, the inverse of SEL, is connected to the gates of P2 and N20. Input SEL connects to enable-fuse 18. Enable-fuse 18 when blown enables the match circuit. The other end of enable-fuse 18 connects to the gates of P3 and N21 and to the drain of N22. The gate of N22 is tied to the positive power supply 28, while the source of N22 is connected to the reference voltage 29. When enable-fuse 18 is blown and when SEL is active (logical 1), line HIT is ready to be activated by the combination of input address and depending if a match-fuse 10 to 17 of the upper fuse section 201 or a match-fuse 10B to 17B of the lower fuse section 202 is blown or not.

Still referring to FIG. 2, the fuse section will be explained next. The fuse section comprises an upper and lower fuse section 201 and 202, respectively. Each fuse section consists of a group of seven strings, each string made up of a serial connection comprising a match-fuse and an n-channel transistor. As just mentioned the upper match fuses are labeled from 10 to 17 and the lower match-fuses are labeled from 10B to 17B. These match-fuses are used to match the address of a failing column e.g. S0 to S7. One end of each fuse is connected to line HIT. The other end of each fuse is connected to the drain of the n-channel transistor, and the source of each transistor is connected to the reference voltage 29. The gates of the eight transistors of the upper group are connected to address lines B0, B1, B2, B3, B4, B5, B6, and B7, respectively. The gates of the eight transistors of the lower group are connected to address lines B0B, B1B, B2B, B3B, B4B, B5B, B6B, and B7B, respectively. The suffix 'B' implies that these lines are the logical inverse of the address lines of the upper group. Inverter 23 is connected between line HIT and output HITB.

Of related art patents, U.S. Pat. No. 5,663,924 (Barth, Jr. et al.) provides an SDRAM with a boundary-independent block decoder, which can provide data in various burst lengths and in both interleaved and sequential modes. U.S. Pat. No. 5,610,874 (Park et al.) describes an address decoder for an SDRAM optimized for a fast burst mode operation. U.S. Pat. No. 5,629,903 (Agata) discloses an address decoder for an SDRAM having pre-decoders for fast column-select line activation.

SUMMARY OF THE INVENTION

It is an object of the present invention to provide circuits and a method which generate from one address two decoded outputs to select, in one cycle, two locations in a double data rate (DDR) SDRAM.

Another object of the present invention is to provide for sequential and interleaved mode addressing and for data bursts of different lengths.

A further object of the present invention is to provide the above benefits without incurring performance degradation or an increase in circuit size (semiconductor area).

These objects have been achieved by devising logically minimized circuits comprising a novel class decoder, even pre-decoders, odd pre-decoders, and for redundancy decoding an odd match circuit, and an even match circuit.

BRIEF DESCRIPTION OF THE DRAWINGS

FIGS. 1a to 1h each show a simple column pre-decoding circuit of the prior art.

FIG. 2 is a circuit diagram of a match circuit for redundancy decoding of the prior art.

DESCRIPTION OF THE PREFERRED EMBODIMENT

In a double data rate (DDR) memory the data transfer rate is twice that of a regular Synchronous Dynamic Random Access Memory (SDRAM), because the DDR's I/O data can be strobed and be available at every rising and falling clock edge i.e. twice in every memory clock cycle. However, the address input timing of a DDR SDRAM is the same as the regular SDRAM. Hence the decoder must be changed from the traditional one-address-to-one-location-selected scheme to a one-address-to-two-location-selected scheme.

Figure 9:
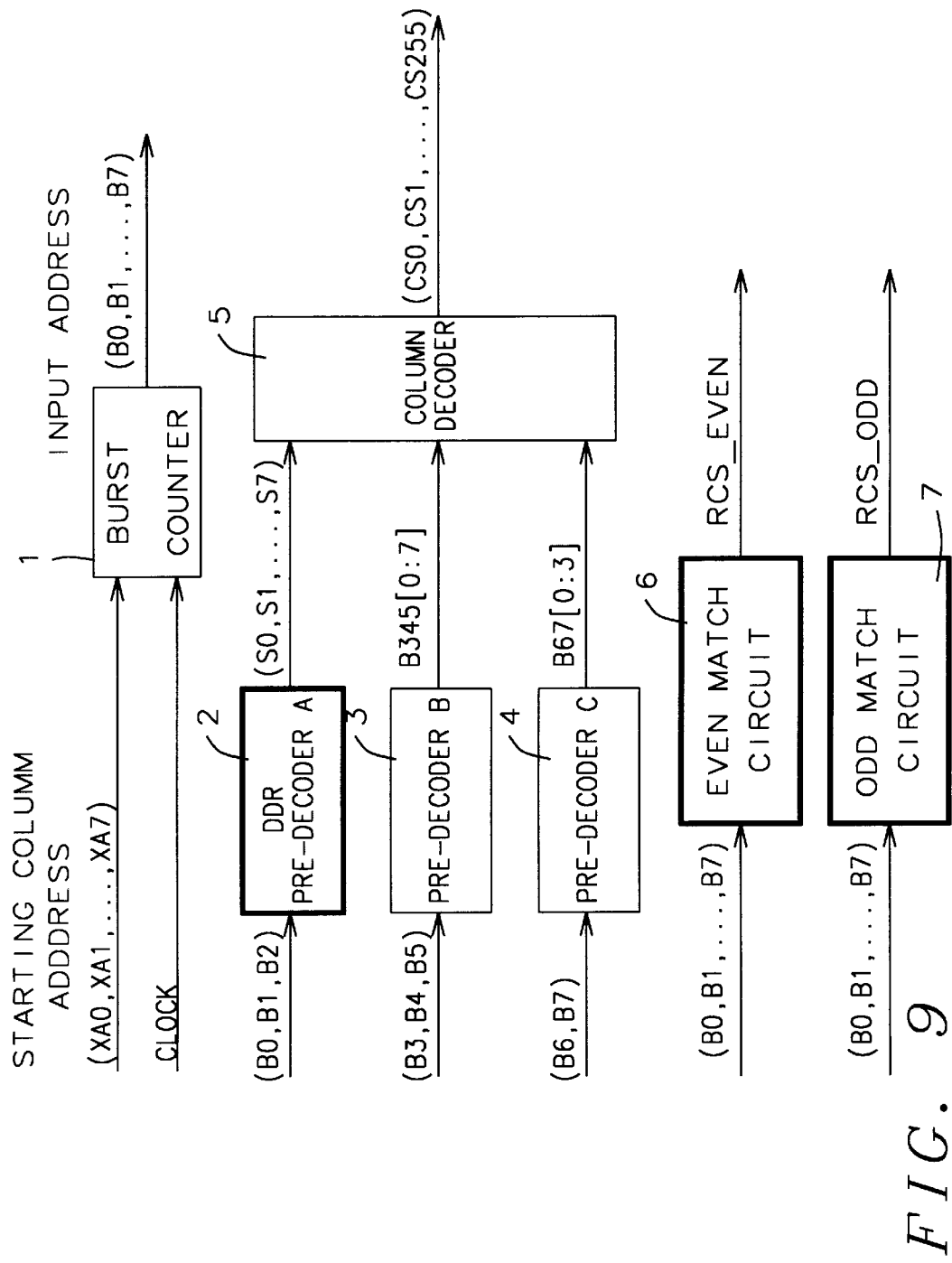
FIG. 9 is a general block diagram of the invention.

FIG. 9 is a high level block diagram of the address decoding scheme for a DDR memory. Block 1 is a burst counter with input STARTING COLUMN ADDRESS comprising the set of 8 lines {XA0,XA1, . . . ,XA7} and a CLOCK input. The output of Block 1 is named INPUT ADDRESS and comprises the set of 8 lines {B0,B1, . . . ,B7}. Block 2 (DDR PRE-DECODER A) receives lines {B0,B1,B2} from Block 1. Block 3 (PRE-DECODER B) receives lines {B3,B4,B5} from Block 1, and Block 4 (PRE-DECODER C) receives lines {B6,B7} from Block 1. The COLUMN DECODER (Block 5) receives as inputs the set of 8 lines {S0,S1, . . . ,S7} from Block 2, output B345[0:7] from Block 3 consisting of 8 lines, and output B67[0:3] from Block 4 consisting of 4 lines. Block 5 decodes the aforementioned total of 20 inputs into 256 outputs {CS0,CS1, . . . ,CS255}. Block 6 (EVEN MATCH CIRCUIT) and Block 7 (ODD MATCH CIRCUIT) both receive from Block 1 the 8 INPUT ADDRESS lines {B0,B1, . . . ,B7}. Output RCS_EVEN of Block 6 selects one even redundant column and output RCS_ODD of Block 7 selects one odd redundant column.

FIG. 9 illustrates the principle of the present invention, where Blocks 2, 6 and 7 (with heavy borders) are illustrated in greater detail in FIGS. 4, 5, 7 and 8:

1. For a Single Data Rate (SDR) memory the burst counter (Block 1) can increase the starting address by one at each clock rising edge to generate the input address for the COLUMN DECODER (Block 5).

For a Double Data Rate (DDR) memory the burst counter (Block 1) can increase the starting address by two at each clock rising edge to generate the input address for the COLUMN DECODER (Block 5).

2. DDR PRE-DECODER A (Block 2) is functioning as a "one-address-to-two-locations-selected" pre-decoder.

It activates two adjacent pre-decoder outputs from the set {S0,S1, . . . ,S7} at the same time. This is the central idea of this present invention.

3. PRE-DECODER B (Block 3) and C (Block 4) are the same as the traditional pre-decoder circuits. They function as "one-address-to-one-location-selected" pre-decoders.

4. For DDR operation, two adjacent (or boundary adjacent) outputs from the set {CS0,CS1, . . . ,CS255}, where CS stands for Column Selector, will be activated simultaneously with one input address by this present invention.

What this present invention provides is an address decoding circuit which decodes two outputs from one input address in the same memory cycle; where the first output represents the input address and the second output represents the decode of the next address. This next address is always adjacent or boundary adjacent to the input address, as demonstrated in TABLE 1.

The DDR memory addressing is based on various conditions including the input address, sequential or interleave mode, and different burst lengths. Details of this will be discussed more extensively later. Class decoders are, therefore, employed which arrange these various conditions into three classes. Outputs of these class decoders then gate one of two pre-decoders. The supplied address is called the 'input address' and from it are decoded a first and a second output, equal to two memory locations. The first output is decoded from the input address and this process is referred to as "self-decoding", while the second output decodes the next address using the input address and this process is referred to as "extra-decoding". Since two adjacent or boundary adjacent locations have to be selected, address decoders are designed to select an even and odd column of the memory in the same memory cycle. Another set of addressing circuits is needed for addressing redundant memory columns. The circuits labeled 'match circuits' select an even and odd redundant column of the memory.

Figure 3A:
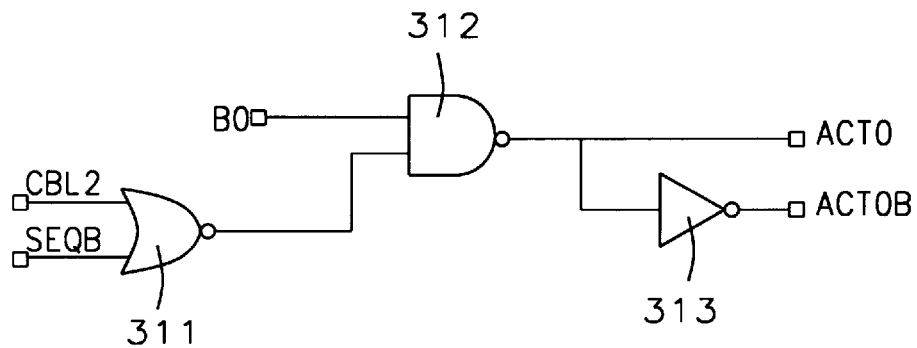
FIGS. 3a to 3c are the class decoder circuits of the present invention.
Figure 3B:
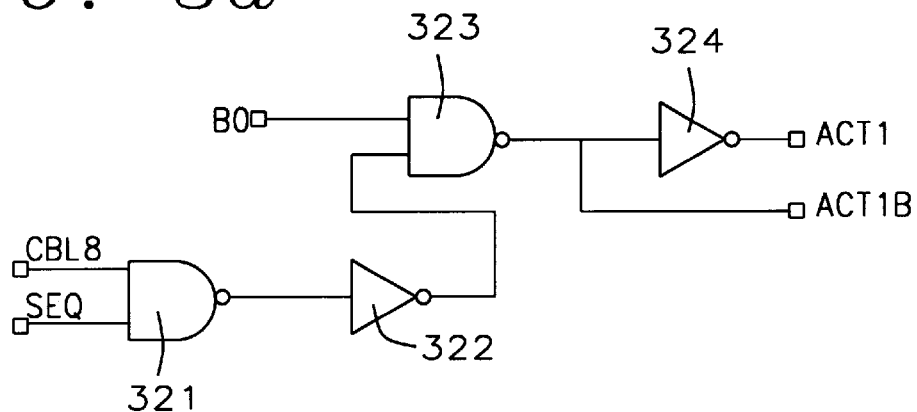
Figure 3C:
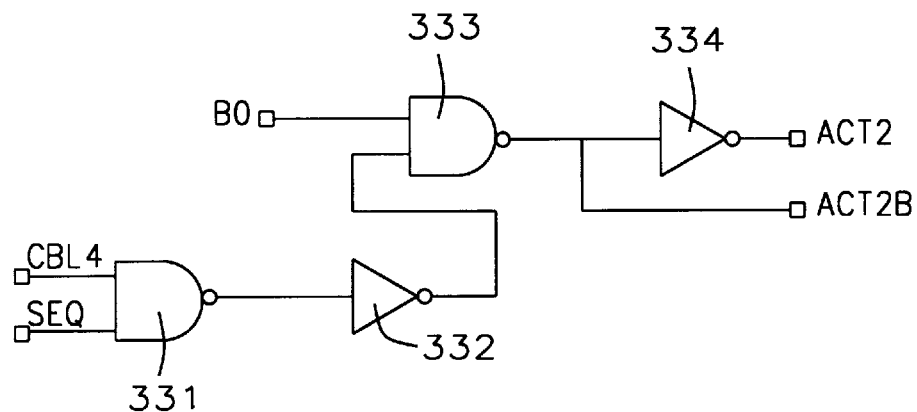

Referring now to the accompanying drawings, a preferred embodiment of the invention is shown. FIGS. 3a, 3b, and 3c show the three class decoders Class 0, Class 1, and Class 2, respectively. Each class decoder comprising three inputs and two outputs, the second output representing the inverse of the first output, and where each class decoder consists of logic gates for determining classes of memory addressing.

FIGS. 4a, 4b, 4c, and 4d show the preferred embodiment of the four even address pre-decoders with a first and second set of inputs and an output, where the first set of inputs connects to the input address, the second set of inputs connects to the outputs of the class decoders of FIGS. 3a, 3b, and 3c, and each even address pre-decoder consists of NAND logic gates and pass gates for selecting even columns of the memory.

FIGS. 5a, 5b, 5c, and 5d show the preferred embodiment of a first, second, third, and fourth odd address pre-decoder with a first and second input and an output for each of the odd address pre-decoders, the inputs of these odd address pre-decoders are connected to the input address. Each odd address pre-decoder consists of a NAND logic gate and an inverter for selecting odd columns of the memory.

Figure 6:
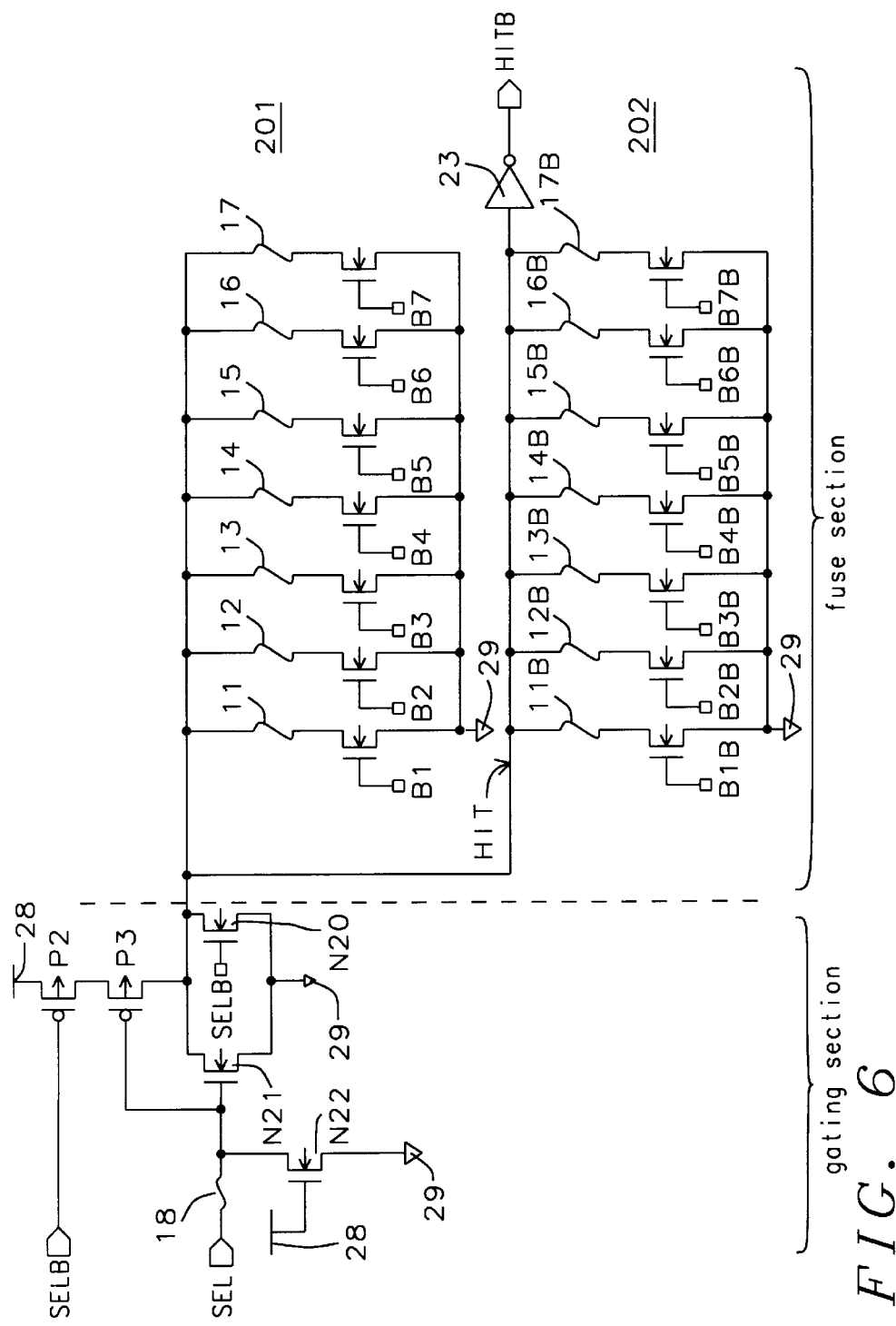
FIG. 6 is the odd match circuit of the present invention.

FIG. 6 depicts the preferred embodiment of the odd match circuit with a first set of inputs connected to a gating section, a second set of inputs connected to input addresses of a fuse section, and an output for selecting a redundant odd column of the memory.

Figure 7:
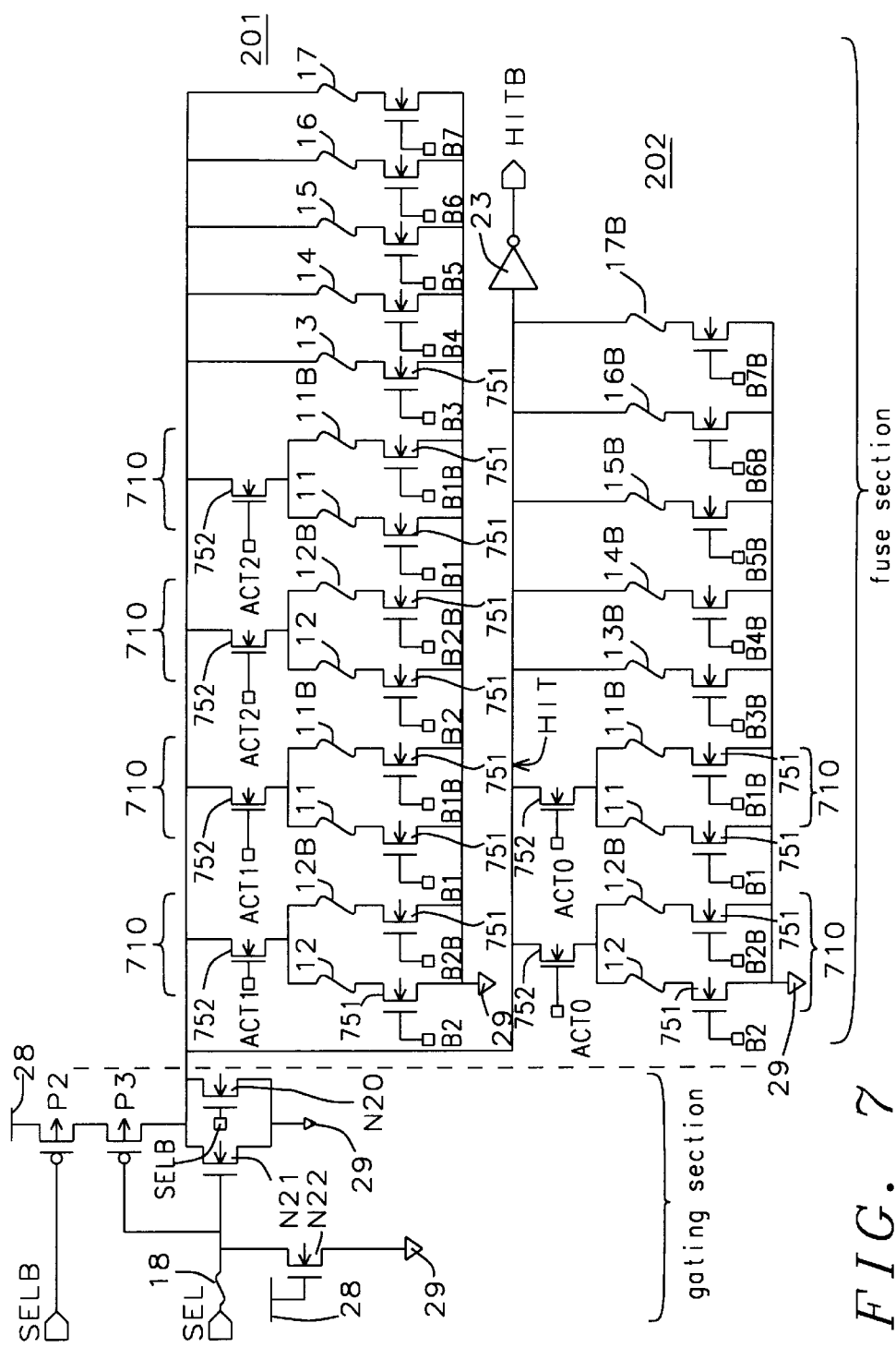
FIG. 7 is an even match circuit of the present invention.

FIG. 7 depicts the one embodiment of the even match circuit with a first set of inputs connected to a gating section, a second set of inputs connected to input addresses of a fuse section (the input addresses are the same set of input addresses as those of FIG. 6), and a third set of inputs connected to the outputs of the class decoders of FIGS. 3a, 3b, and 3c. The output of FIG. 7 selects a redundant even column of the memory.

Figure 8:
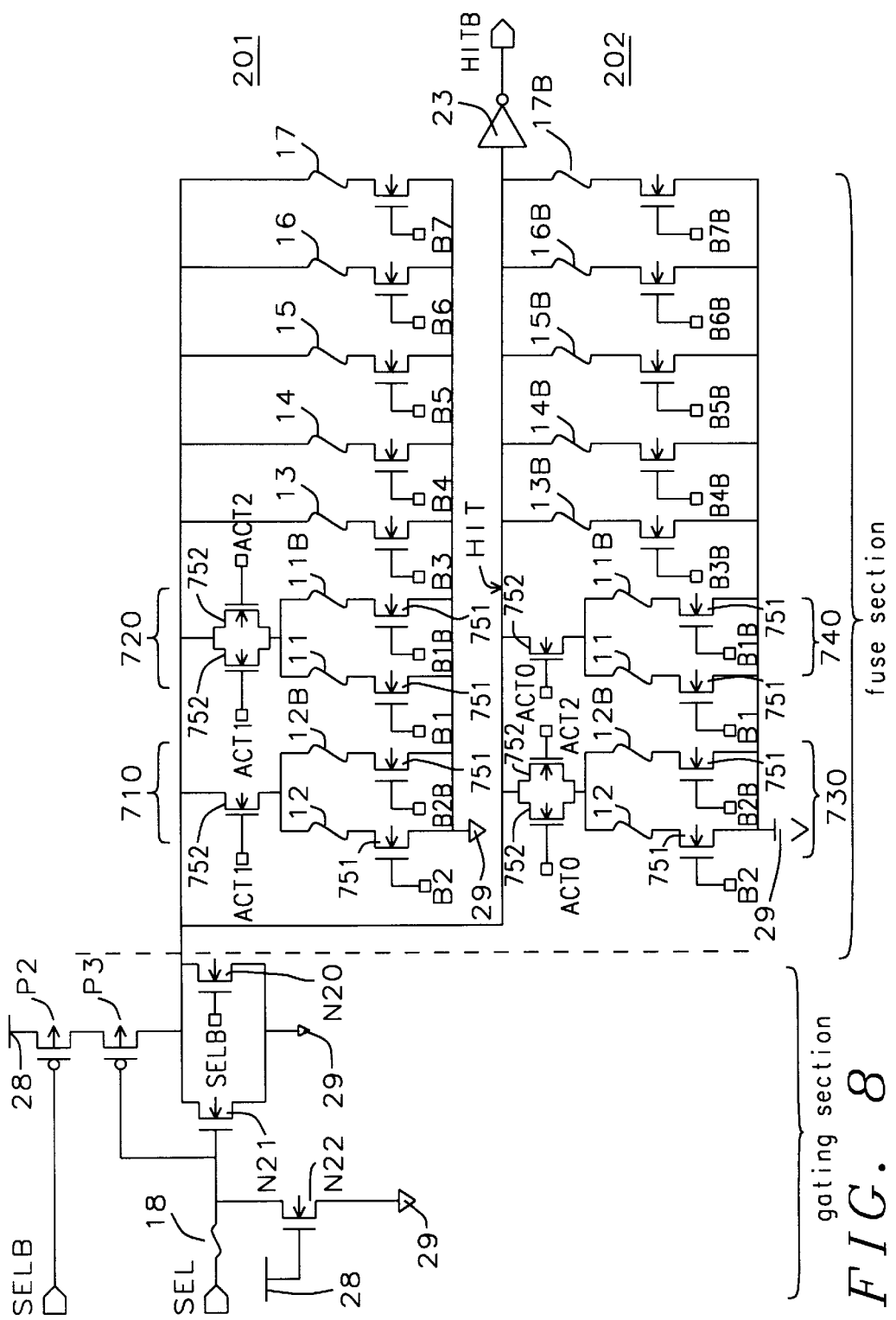
FIG. 8 is the preferred embodiment of the even match circuit of the present invention.

FIG. 8 depicts a reduced circuit count and preferred embodiment of the even match circuit with a first set of inputs connected to a gating section, a second set of inputs connected to input addresses of a fuse section (the input addresses are the same set of input addresses as those of FIG. 7), and a third set of inputs connected to the outputs of the class decoders of FIG. 3a, 3b, and 3c. The output of FIG. 8 selects a redundant even column of the memory.

The class decoder circuit is designed to take care of the different types of addressing schemes such as input address B0, burst type and burst length. B0 classifies the input address as odd or even. The burst type is either sequential or interleaved mode. The sequential mode is an incremental decoding scheme within a boundary address which wraps around to the least significant address (=0). The interleaved mode is a scrambled decoding scheme from the least significant address bit B0 to B2, depending on the burst length. For details of the addressing refer to TABLE 1. If the input address is even (B0=0), then the next address (the implied extra address) will be odd (B0=1), or vice versa, i.e. if the burst length BL is 2 and if the input address is 001, then the next address is 000. For sequential mode the burst length can be 2, 4, 8 and full page (256). But for the combination of full page and sequential type the input address must even. For interleaved mode the burst length can only be 2, 4, and 8. The conditions of allowed input address, burst type and burst mode are tested in accordance with TABLE 2 below.

TABLE 2

| | allowed input addresses: | |
|---|---|---|
| | Burst Length | Input address |
| Interleave Mode | 2 | E/O |
| | 4 | E/O |
| | 8 | E/O |
| Sequential Mode | 2 | E/O |
| | 4 | E/O |
| | 8 | E/O |
| | Full Page | E | where E: even and O: odd

For both the sequential and interleave mode if the input address is even, then the second decoded output will be odd (S1, S3, S5, S7). If the input address is odd, then second decoded output will be even (S0, S2, S4, S6). This is because the relationship of input address to the second decoded output is always adjacent or boundary adjacent, as shown in TABLE 1. The algorithm for the second decoded output is complex when the DDR memory is operated in the various modes of burst type, burst length and even or odd input address. This algorithm can be grouped into three classes. These three classes create the boolean tables for the first and second decoded output based on input address B0 and burst mode according to the adjacent boundary limitation of the pre-decoding output {S0, S1, S2, S3, S4, S5, S6, S7}.

Class 0.a: the input address and burst mode satisfy the condition

SEQ $\wedge$(B0=0)—i.e. the input address is even

OR

SEQ $\wedge$BL2 $\wedge$(B0=0)

OR not SEQ $\wedge$(B0=0)—i.e. interleaved where SEQ stands for 'sequential', B0 is the least significant address bit, and BL2 stands for 'burst length of 2'.

Because B0=0, i.e. the input address is even, the first output will be activated by one of the even pre-decoding outputs {S0, S2, S4, S6} and the second output will be activated by one of the odd pre-decoding outputs {S1, S3, S5, S7}.

The first output is a straight decode (self-decode) of the input address while the second output must be decoded with the extra-decoding process as follows:

| input address | | | | | (next address) | | |
|---|---|---|---|---|---|---|---|
| B2 | B1 | B0 | | second output | (B2 | B1 | B0) |
| 0 | 0 | 0 | adj —> | (S1) | (0 | 0 | 1) |
| 0 | 1 | 0 | adj —> | (S3) | (0 | 1 | 1) |
| 1 | 0 | 0 | adj —> | (S5) | (1 | 0 | 1) |
| 1 | 1 | 0 | adj —> | (S7) | (1 | 1 | 1) |

(adj = adjacent)

i.e. the second output (S1,S3,S5,S7) will be activated by the input address (B2,B1)={(0,0),(0,1),(1,0),(1,1)}.

Class 0.b: the input address and burst mode satisfy the condition

SEQ $\wedge$BL2 $\wedge$(B0=1)—i.e. input address is odd

OR not SEQ $\wedge$(B0=1)—i.e. interleaved

Because B0=1, i.e. the input address is odd, the first output will be activated by one of the odd pre-decoding outputs {S1, S3, S5, S7} and the second output will be activated by one of the even pre-decoding outputs {S0, S2, S4, S6}.

The first output is a straight decode (self-decode) of the input address while the second output must be decoded with the extra-decoding process as follows:

| input address | | | | | (next address) | | |
|---|---|---|---|---|---|---|---|
| B2 | B1 | B0 | | second output | (B2 | B1 | B0) |
| 0 | 0 | 1 | b. adj —> | (S0) | (0 | 0 | 0) |
| 0 | 1 | 1 | b. adj —> | (S2) | (0 | 1 | 0) |
| 1 | 0 | 1 | b. adj —> | (S4) | (1 | 0 | 0) |
| 1 | 1 | 1 | b. adj —> | (S6) | (1 | 1 | 0) |

(b. adj=boundary adjacent)

i.e. the second output (S0,S2,S4,S6) will be activated by the input address (B2,B1)={(0,0), (0,1) (1,0),(1,1)}.

Class 1: the input address and burst mode satisfy the condition SEQ $\wedge$BL8 $\wedge$(B0=1) i.e. the input address is odd where BL8 stands for 'burst length of 8'.

The adjacent boundary of the first output and second output is limited within the block of eight burst. Because B0=1, i.e. the input address is odd, the first output will be activated by one of the odd pre-decoding outputs {S1, S3, S5, S7} and the second output will be activated by one of the even pre-decoding outputs {S0, S2, S4, S6}.

The first output is a straight decode (self-decode) of the input address while the second output must be decoded with the extra-decoding process as follows:

| input address | | | | (next address) | | |
|---|---|---|---|---|---|---|
| B2 | B1 | B0 | second output | (B2 | B1 | B0) |
| 0 | 0 | 1 adj —> | (S2) | (0 | 1 | 0) |
| 0 | 1 | 1 adj —> | (S4) | (1 | 0 | 0) |
| 1 | 0 | 1 adj —> | (S6) | (1 | 1 | 0) |
| 1 | 1 | 1 b. adj —> | (S0) | (0 | 0 | 0) |

(adj=adjacent)
(b. adj=boundary adjacent)
i.e. the second output (S0,S2,S4,S6) will be activated by the input address (B2,B1)={(1,1),(0,0),(0,1),(1,0)}.

Class 2: the input address and burst mode satisfy the condition SEQ ∧BL4 ∧(B0=1) i.e. the input address is odd where BL4 stands for 'burst length of 4'.

The adjacent boundary of the first output and second output is limited within the block of four burst.

Because B0=1, i.e. the input address is odd, the first output will be activated by one of the odd pre-decoding outputs {S1, S3, S5, S7} and the second output will be activated by one of the even pre-decoding outputs {S0, S2, S4, S6}.

The first output is a straight decode (self-decode) of the input address while the second output must be decoded with the extra-decoding process as follows:

| input address | | | | (next address) | | |
|---|---|---|---|---|---|---|
| B2 | B1 | B0 | second output | (B2 | B1 | B0) |
| 0 | 0 | 1 adj —> | (S2) | (0 | 1 | 0) |
| 0 | 1 | 1 b. adj —> | (S0) | (0 | 0 | 0) |
| 1 | 0 | 1 adj —> | (S6) | (1 | 1 | 0) |
| 1 | 1 | 1 b. adj —> | (S4) | (1 | 0 | 0) |

(adj=adjacent)
(b. adj=boundary adjacent)
i.e. the second output (S0,S2,S4,S6) will be activated by the input address (B2,B1)={(0,1),(0,0),(1,1),(1,0)}.

The above relationships are represented in TABLE 3 and result in the following equations (as implemented in the logic circuits of FIG. 3):

Class 0: ACT0=¬(¬(¬SEQ ∨BL2) ∧B0) or
ACT0=¬SEQ ∨BL2 ∨¬B0  (¬implies logical NOT)
Class 1: ACT1=SEQ ∧BL8 ∧B0
Class 2: ACT2=SEQ ∧BL4 ∧B0
Class 0+Class 1+Class 2=entire set of conditions, (where full page and sequential belongs to Class 0.a: SEQ ∧(B0=0)).

Applying above to the DDR decoder:
two of the DDR pre-decoding outputs {S0,S1,S2,S3, . . . ,S7} of address B2,B1,B0 will be active simultaneously, where one of the decoding outputs belongs to the even set {S0,S2,S4,S6}, while the other decoding output belongs to the odd set {S1,S3, S5,S7}, and where the two decoding outputs are adjacent or boundary adjacent. For example, when Burst Length=8, S3 and S4 are adjacent and S7 and S0 are boundary adjacent, but when Burst Length=4, then S3 and S0 are boundary adjacent and there is no adjacent relation between S3 and S4.

In TABLE 3 below, Class 0, Class 1, and Class 2 are grouped in terms of even outputs (S0, S2, S4, S6) and odd outputs (S1, S3, S5, S6). Equations derived from TABLE 3 for the even decoder are expressed in the logic of FIGS. 4a to 4d, while equations derived for the odd decoder are expressed in the logic of FIGS. 5a to 5d.

TABLE 3 even/odd decode:

| condition | | input | |
|---|---|---|---|
| | | B2 | B1 |
| S0 is selected if: | | | |
| self-decoding | Class 0 | 0 | 0 |
| extra-decoding | Class 1 | 1 | 1 |
| | Class 2 | 0 | 1 |
| S1 is selected if: | | | |
| self-decoding | Class 0 | 0 | 0 |
| extra-decoding | Class 1 | 0 | 0 |
| | Class 2 | 0 | 1 |
| S2 is selected if: | | | |
| self-decoding | Class 0 | 0 | 1 |
| extra-decoding | Class 1 | 0 | 0 |
| | Class 2 | 0 | 0 |
| S3 is selected if: | | | |
| self-decoding | Class 0 | 0 | 1 |
| extra-decoding | Class 1 | 0 | 1 |
| | Class 2 | 0 | 1 |
| S4 is selected if: | | | |
| self-decoding | Class 0 | 1 | 0 |
| extra-decoding | Class 1 | 0 | 1 |
| | Class 2 | 1 | 1 |
| S5 is selected if: | | | |
| self-decoding | Class 0 | 1 | 0 |
| extra-decoding | Class 1 | 1 | 0 |
| | Class 2 | 1 | 0 |
| S6 is selected if: | | | |
| self-decoding | Class 0 | 1 | 1 |
| extra-decoding | Class 1 | 1 | 0 |
| | Class 2 | 1 | 0 |
| S7 is selected if: | | | |
| self-decoding | Class 0 | 1 | 1 |
| extra-decoding | Class 1 | 1 | 1 |
| | Class 2 | 1 | 1 |

Referring now back to FIG. 3a, we show Class 0 decoder receiving as inputs address B0 (where address B0 is the least significant bit of the input address), logical signal BL2 (burst length 2), and the logical inverse of a logical signal SEQ, designated as SEQB. Note that subsequently the convention will be used where the designation "signalB" stands for the inverse of "signal". In a preferred embodiment NOR gate 311 receives inputs BL2 and SEQB. NAND gate 312 receives as inputs B0 and the output of gate 311. The output of gate 312 feeds ACT0 and inverter 313, which is connected to ACT0B.

Referring back to FIG. 3b, we show Class 1 decoder receiving as inputs address B0, logical signal BL8 (burst length 8), and the logical inverse of logical signal SEQ. In a preferred embodiment NOR gate 321 receives inputs BL8 and SEQ. The output of gate 321 feeds inverter 322. NAND gate 323 receives as inputs B0 and the output of inverter 322.

The output of gate 323 feeds ACT1B and inverter 324, which is connected to ACT1.

Referring back to FIG. 3c, we show Class 2 decoder receiving as inputs address B0, logical signal BL4 (burst length 4), and the logical inverse of logical signal SEQ. In a preferred embodiment NOR gate 331 receives inputs BL4 and SEQ. The output of gate 331 feeds inverter 332. NAND gate 333 receives as inputs B0 and the output of inverter 332. The output of gate 333 feeds ACT2B and inverter 334, which is connected to ACT2.

Figure 4A:
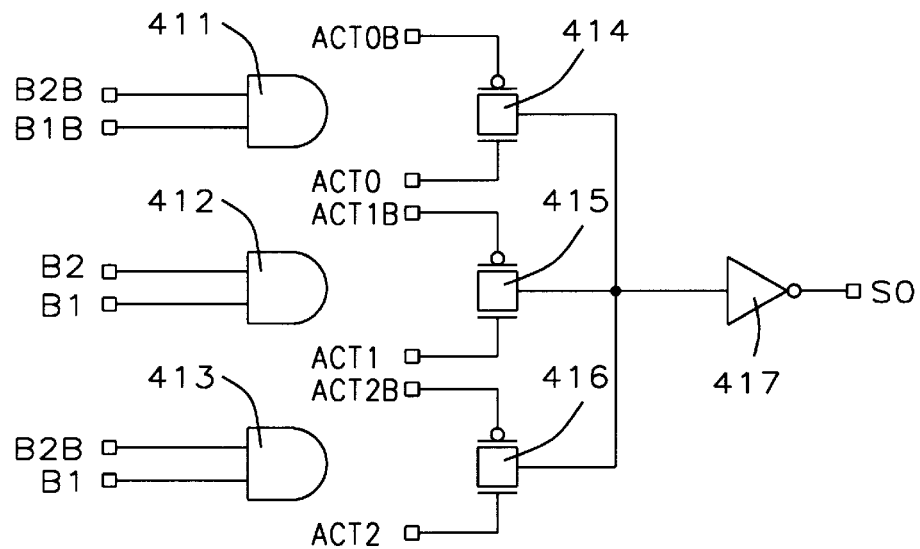
FIGS. 4a to 4d are the even pre-decoder circuits of the present invention.

Referring now to FIG. 4a, we show the S0 even pre-decoder receiving a first set of inputs consisting of address B1, B2 and their logical inverses B1B, B2B, and a second set of inputs consisting of the outputs of the class decoders and their logical inverses. In a preferred embodiment the S0 even address decoder consists of NAND gates 411, 412, 413, pass-gates 414, 415, 416, and inverter 417. B2B and B1B are inputs of gate 411, B2 and B1 are inputs of gate 412, B2B and B1 are inputs of gate 413. ACT0B and ACT0 feed pass-gate 414, ACT1B and ACT1 feed pass-gate 415 and ACT2B and ACT2 feed pass-gate 416. Gate 411 connects to pass-gate 414, gate 412 feeds pass-gate 415, and gate 413 feeds pass-gate 416. The output of the three pass-gates is DOT OR'ed into inverter 417, which feeds output S0.

Figure 4B:
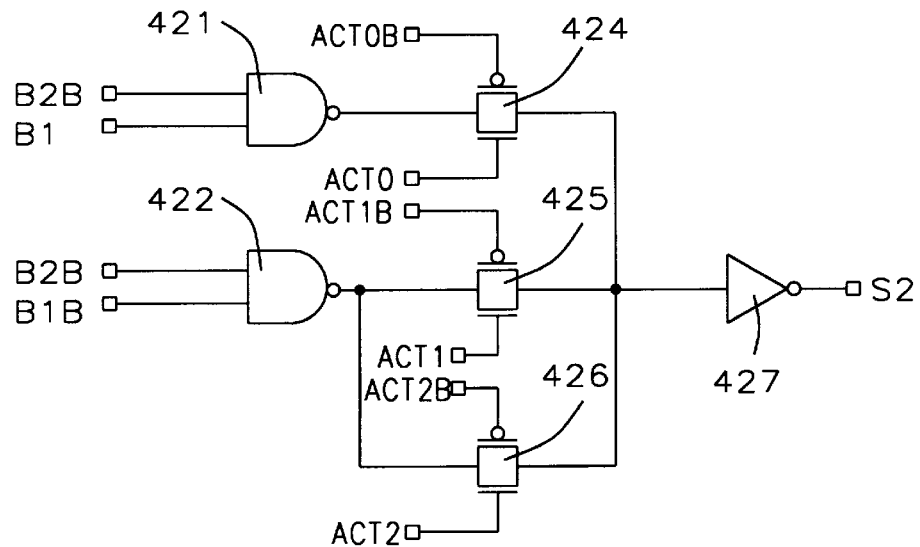

Referring now to FIG. 4b, we show the S2 even pre-decoder receiving a first set of inputs consisting of address B1, and its logical inverse B1B, and B2B, the logical inverse of address B2, and a second set of inputs consisting of the outputs of the class decoders and their logical inverses. In a preferred embodiment the S2 even address decoder consists of NAND gates 421, 422, pass-gates 424, 425, 426, and inverter 427. B2B and BE are inputs of gate 421, B2B and B1B are inputs of gate 422. ACT0B and ACT0 feed pass-gate 424, ACT1B and ACT1 feed pass-gate 425 and ACT2B and ACT2 feed pass-gate 426. Gate 421 connects to pass-gate 424, and gate 422 feeds pass-gates 425 and 426. The output of the three pass-gates is DOT OR'ed into inverter 427, which feeds output S2.

Figure 4C:
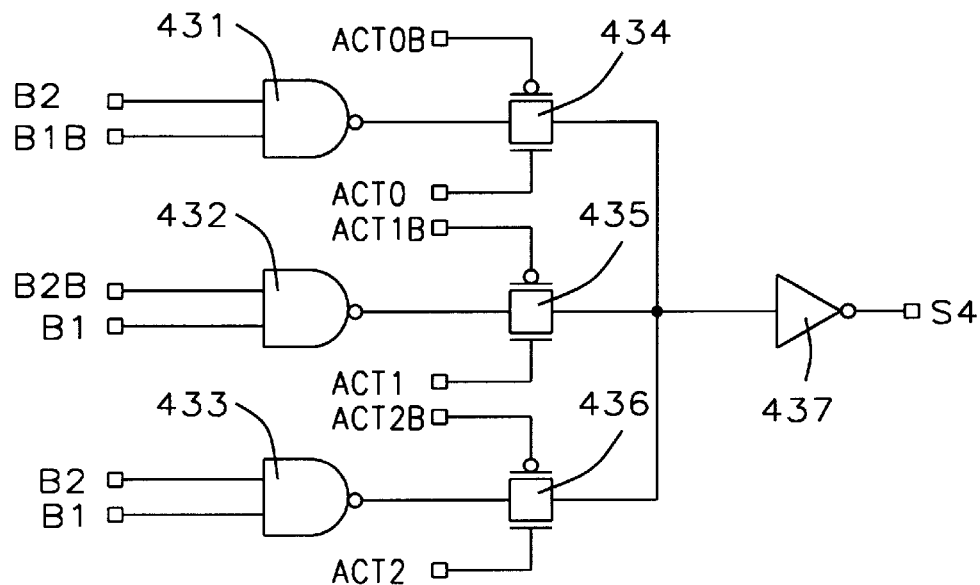

Referring now to FIG. 4c, we show the S4 even pre-decoder receiving a first set of inputs consisting of address B1, B2 and their logical inverses B1B, B2B, and a second set of inputs consisting of the outputs of the class decoders and their logical inverses. In a preferred embodiment the S4 even address decoder consists of NAND gates 431, 432, 433, pass-gates 434, 435, 436, and inverter 437. B2 and B1B are inputs of gate 431, B2B and B1 are inputs of gate 432, B2 and B1 are inputs of gate 433. ACT0B and ACT0 feed pass-gate 434, ACT1B and ACT1 feed pass-gate 435 and ACT2B and ACT2 feed pass-gate 436. Gate 431 connects to pass-gate 434, gate 432 feeds pass-gate 435, and gate 433 feeds pass-gate 436. The output of the three pass-gates is DOT OR'ed into inverter 437, which feeds output S4.

Figure 4D:
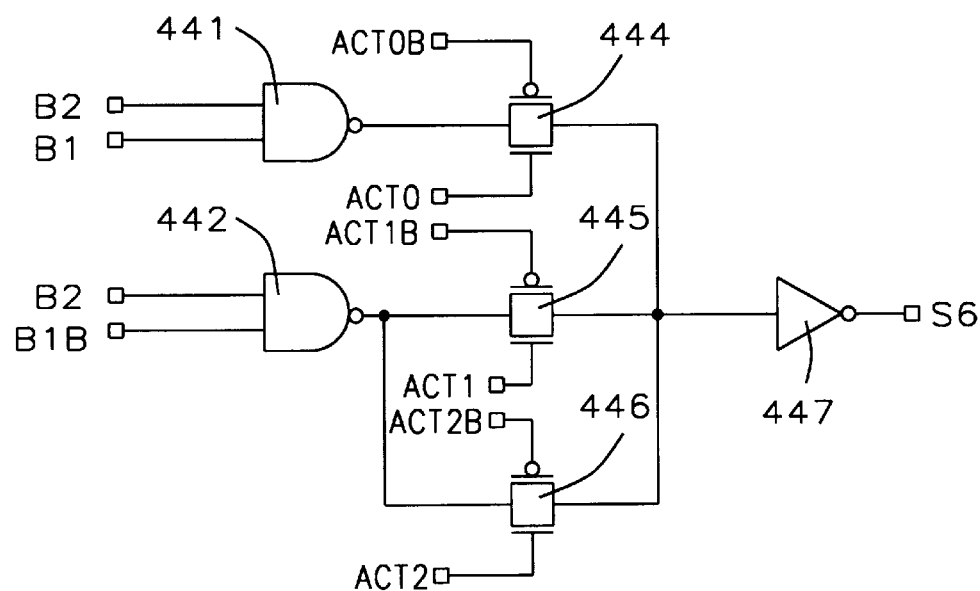

Referring now to FIG. 4d, we show the S6 even pre-decoder receiving a first set of inputs consisting of address B1, and its logical inverse B1B, address B2, and a second set of inputs consisting of the outputs of the class decoders and their logical inverses. In a preferred embodiment the S6 even address decoder consists of NAND gates 441, 442, pass-gates 444, 445, 446, and inverter 447. B2 and BI are inputs of gate 441, B2 and B1B are inputs of gate 442. ACT0B and ACT0 feed pass-gate 444, ACT1B and ACT1 feed pass-gate 445, and ACT2B and ACT2 feed pass-gate 446. Gate 441 connects to pass-gate 444 and gate 442 feeds pass-gates 445 and 446. The output of the three pass-gates is DOT OR'ed into inverter 447, which feeds output S6.

Figure 5A:
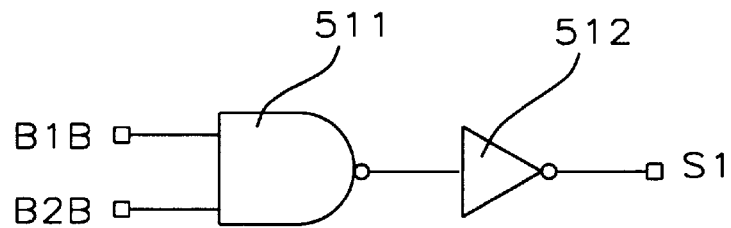
FIGS. 5a to 5d are the odd pre-decoder circuits of the present invention.

Referring now to FIG. 5a, we show the S1 odd pre-decoder with inputs B1B and B2B. In a preferred embodiment inputs B1B and B2B connect to NAND gate 511, which itself is connected to inverter 512. The output of inverter 512 connects to output S1.

Figure 5B:
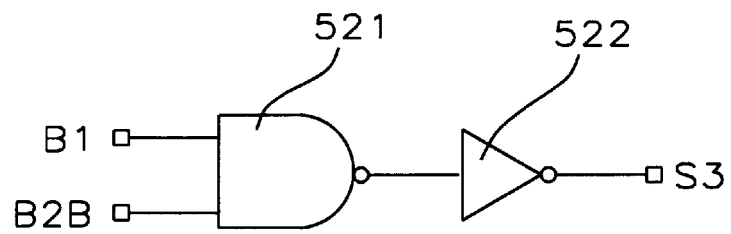

Referring now to FIG. 5b, we show the S3 odd pre-decoder with inputs B1 and B2B. In a preferred embodiment inputs B1 and B2B connect to NAND gate 521, which itself is connected to inverter 522. The output of inverter 522 connects to output S3.

Figure 5C:
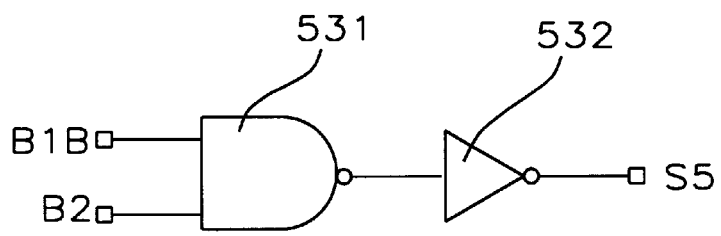

Referring now to FIG. 5c, we show the S5 odd pre-decoder with inputs B1B and B2. In a preferred embodiment inputs B1B and B2 connect to NAND gate 531, which itself is connected to inverter 532. The output of inverter 532 connects to output S5.

Figure 5D:
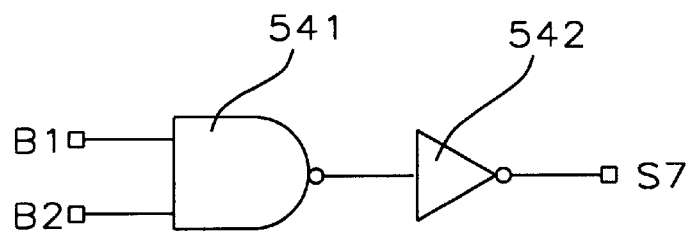

Referring now to FIG. 5d, we show the S7 odd pre-decoder with inputs B1 and B2. In a preferred embodiment inputs B1 and B2 connect to NAND gate 541, which itself is connected to inverter 542. The output of inverter 542 connects to output S7.

The schematic for the redundancy decoder of the odd match circuit of FIG. 6 is the same as that of FIG. 2 (and using the same numerals), except that the fuse-transistor strings for inputs B0 and B0B are absent because address position B0 is a "don't care" condition. This is because odd pre-decoding outputs {S1, S3, S5, S7} are decoded through self-decoding when B0=1 or through extra-decoding when B0=0. This and other aspects of the match circuits are explained in more detail by the following example:

If the failing column address is even (B7, . . . B3, B2, B1, B0)=(0, . . . 0, 0, 0, 0).

In order to repair it, the even match circuit (since B0=0) must be activated by 3 input addresses dependent on Class 0, 1, or 2.

1) (B7, . . . B3, B2, B1, B0)=(0, . . . 0, 0, 0, 0) this is called "self-decoding" belonging to Class 0, because it is the failed address itself.

2) (B7, . . . B3, B2, B1, B0)=(0, . . . 0, 1, 1, 1) this is called "extra-decoding" belonging to Class 1, because the previous boundary adjacent address has a block length= 8.

3) (B7, . . . B3, B2, B1, B0)=(0 ,. . . 0, 0, 1, 1) this is called "extra-decoding" belonging to Class 2, because the previous boundary adjacent address has a block length= 4.

In other words, the object of the match circuit is to replace a failed regular column. Hence, if any even match circuit or odd match circuit had been assigned to replace a failed even or odd regular column, respectively, then they must be activated when the failed address itself or its previous adjacent or previous boundary adjacent address has occurred.

Because the previous address of any odd address only occurs in the boundary case of block length=2 (it is only necessary to set B0=0 from the original odd address) the odd match circuit of FIG. 6 can ignore the fuses of B0 to achieve this DDR function. Elimination of B0 does not apply to the even address match circuit as demonstrated in the above example.

The schematic for one embodiment of the redundancy decoder of the even match circuit, as shown in FIG. 7, is analogous to TABLE 3 in terms of the even outputs S0, S2, S4, S6. Hence, this result could be used to implement the redundancy match circuit. In this circuit three sets of fuses for B2, B1 must be blown to define the defective address. One set for Class 0 self-decoding or extra-decoding, the other two sets for Class 1 and Class 2 extra-decoding. However, that scheme requires 12 fuses and 18 transistors for address B2 and Bi alone. The gating sections of FIG. 7 and FIG. 6 are identical and the fuse section of FIG. 7 is similar to the fuse section of FIG. 6 for addresses B3 to B7 and B3B and B7B. Numerals of FIG. 6 designate the same members in FIG. 7. In the upper fuse section 201 four selection circuits 710 replace two strings with match fuse 11 and 12. In the lower fuse section 202 two selection circuits 710 replace the two strings with match-fuses 11B and 12B. Each selection circuit 710 is made up of two parallel strings, each consisting of a fuse and n-channel transistor 751 in series. Each transistor 751 connects to reference voltage 29. The other end of each fuse connects to n-channel transistor 752, which in turn connects to line HIT. The gates of transistors 751 are connected to addresses either B0, B1 or B2 or their inverses. The gate of transistor 752 connects to either ACT0 or ACT1 or ACT2. The six selection circuits have match fuses 11 or 11B or 12 or 12B.

By analyzing TABLE 3 and FIG. 7, redundancies become apparent which are illustrated in TABLE 4 below. Note that B2 of Class 0 and B1 of Class 1 (emphasized) equal the condition for Class 2. Removal of this redundancy reduces the device count to 8 fuses and 8 transistors for the B2 and B1 decode. The circuit of FIG. 8 is the preferred embodiment of that simplified logic.

TABLE 4 even match:

| condition | | input | |
| --- | --- | --- | --- |
| | | B2 | B1 |
| S0 is selected if: | | | |
| self-decoding | Class 0 | 0 | 0 |
| extra-decoding | Class 1 | 1 | 1 |
| | Class 2 | 0 | 1 |
| S2 is selected if: | | | |
| self-decoding | Class 0 | 0 | 1 |
| extra-decoding | Class 1 | 0 | 0 |
| | Class 2 | 0 | 0 |
| S4 is selected if: | | | |
| self-decoding | Class 0 | 1 | 0 |
| extra-decoding | Class 1 | 0 | 1 |
| | Class 2 | 1 | 1 |
| S6 is selected if: | | | |
| self-decoding | Class 0 | 1 | 1 |
| extra-decoding | Class 1 | 1 | 0 |
| | Class 2 | 1 | 0 |

Turning to FIG. 8, we now describe the even match circuit of the invention. Each numeral of FIG. 8 designates the same member in FIG. 7. This circuit is made up of a gating and a fuse section where the gating section is identical to the one described in FIG. 6. The fuse section is similar to the fuse section of FIG. 6 for addresses B3 to B7 and B3B and B7B including inverter 23, but differs for addresses B1, B2, B1B and B2B.

The modified fuse section comprises selection circuits 710, 720, 730, and 740. Circuit 710 is made up of two parallel strings, each consisting of match-fuses 12 and 12B and n-channel transistor 751 in series. Each transistor 751 connects to reference voltage 29. The other end of each match-fuse connects to n-channel transistor 752, which in turn connects to line HIT. The gates of transistors 751 are connected to addresses B2 and B2B, respectively. The gate of transistor 752 connects to ACT1.

Selection circuit 720 is made up of two parallel strings, each consisting of match-fuses 11 and 11B and n-channel transistor 751 in series. Each transistor 751 connects to reference voltage 29. The other end of each match-fuse connects to two n-channel transistors 752 in parallel, which in turn connect to line HIT. The gates of transistors 751 are connected to addresses B1 and B1B, respectively. The gates of transistors 752 connect to ACT1 and ACT2, respectively.

Selection circuit 730 is identical in layout to circuit 720 except that the gates of transistors 751 are connected to address B2 and B2B, respectively, that the match-fuses are 12 and 12B, and that the gates of transistors 752 connect to ACT0 and ACT2, respectively.

Selection circuit 740 is identical in layout to circuit 710 except that the gates of transistors 751 are connected to address B1 and B1B, respectively, that the match-fuses are 11 and 11B, and that the gate of transistor 752 connects to ACT0.

The method of providing an input address and extra-decoding in the same memory cycle involves creating three class decoders to determine into which one of the three classes of memory addressing the memory request belongs. The three classes are illustrated by the logic equations for Class 0, Class 1, and Class 3 shown earlier and include consideration of the burst type (i.e. sequential or interleaved mode) and burst length.

The method of providing from an input address a first output through regular or self-decoding and a second output through extra-decoding is illustrated in TABLE 3 and for redundant columns in TABLE 4. I/O data for the self-decoding process is strobed at the rising edge of the memory clock cycle and I/O data for the extra-decoding process is strobed at the falling edge of the same clock cycle. In this method the input address may be even or odd, where second output from the extra-decoding process is adjacent to the input address, and the second output is available at the same time as the first output.

Advantages of this address decoding scheme for a double data rate SDRAM are the small size of silicon real estate that is required and that there is no degradation of performance, since the second output is decoded at the same time with the first output. In addition decode of the second output does not slow down the decode of the first output.

While the invention has been particularly shown and described with reference to the preferred embodiments thereof, it will be understood by those skilled in the art that various changes in form and details may be made without departing from the spirit and scope of the invention.

What is claimed is:

1. An address decoding circuit for decoding from an input address a first output and a second output in the same memory cycle, comprising:

a first, a second, and a third class decoder each of said class decoders comprising a first, a second, and a third input and a first and a second output, said class decoders consisting of logic gates for determining classes of memory addressing;

a first, a second, a third, and a fourth even pre-decoder with a first and second set of inputs and an output, said first set of inputs connected to said input address, said second set of inputs connected to said outputs of said class decoders, said even pre-decoders consisting of logic gates for selecting even columns of a memory;

a first, a second, a third, and a fourth odd pre-decoder with a first and second input and an output for each of said odd pre-decoders, said inputs of said odd pre-decoders connected to said input address, said odd pre-decoders consisting of logic gates for selecting odd columns of said memory;

an odd match circuit with a first set of inputs connected to a select circuit, and a second set of inputs connected to said input address, and an output for selecting a redundant odd column of said memory; and an even match circuit with a first set of inputs connected to a select circuit, a second set of inputs connected to said input address, a third set of inputs connected to said first and second outputs of said class decoders, and an output for selecting a redundant even column of said memory.

2. The address decoding circuit of claim 1, wherein said first class decoder receives as inputs an address B0, said address B0 being the least significant bit of said input address, a logical signal BL2, and the logical inverse of a logical signal SEQ.

3. The address decoding circuit of claim 2, wherein said second class decoder receives as inputs said address B0, a logical signal BL8, and the logical inverse of said logical signal SEQ.

4. The address decoding circuit of claim 3, wherein said third class decoder receives as inputs said address B0, a logical signal BL4, and the logical inverse of said logical signal SEQ.

5. The address decoding circuit of claim 1, wherein said first even pre-decoder receives as said first set of inputs an address B1, and its logical inverse, an address B2 and its logical inverse, and as said second set of inputs an output of said first class decoder and its logical inverse output, an output of said second class decoder and its logical inverse output, and an output of said third class decoder and its logical inverse output.

6. The address decoding circuit of claim 5, wherein said second even pre-decoder receives as said first set of inputs said address B1, and its logical inverse, said logical inverse of said address B2, and as said second set of inputs the output of said first class decoder and its logical inverse output, the output of said second class decoder and its logical inverse output, and the output of said third class decoder and its logical inverse output.

7. The address decoding circuit of claim 6, wherein said third even pre-decoder receives as said first set of inputs said address B1, and its logical inverse, said address B2 and its logical inverse, and as said second set of inputs the output of said first class decoder and its logical inverse output, the output of said second class decoder and its logical inverse output, and the output of said third class decoder and its logical inverse output.

8. The address decoding circuit of claim 7, wherein said fourth even pre-decoder receives as said first set of inputs said address B1, and its logical inverse, said address B2, and as said second set of inputs the output of said first class decoder and its logical inverse output, the output of said second class decoder and its logical inverse output, and the output of said third class decoder and its logical inverse output.

9. The address decoding circuit of claim 5, wherein said first odd pre-decoder receives as said first input the logical inverse of said address B1, and as said second input the logical inverse of said address B2.

10. The address decoding circuit of claim 9, wherein said second odd pre-decoder receives as said first input said address B1, and as said second input the logical inverse of said address B2.

11. The address decoding circuit of claim 10, wherein said third odd pre-decoder receives as said first input the logical inverse of said address B1, and as said second input said address B2.

12. The address decoding circuit of claim 11, wherein said fourth odd pre-decoder receives as said first input said address B1, and as said second input said address B2.

13. The address decoding circuit of claim 1, wherein said odd match circuit receives as said first set of inputs a logical signal SEL and its logical inverse, and as said second set of inputs addresses B1, B2, B3, B4, B5, B6, B7, and the logical inverse of said addresses B1, B2, B3, B4, B5, B6, B7.

14. The address decoding circuit of claim 13, wherein said even match circuit receives as said first set of inputs said logical signal SEL and its logical inverse, as said second set of inputs said addresses B1, B2, B3, B4, B5, B6, B7, and the logical inverse of said addresses B1, B2, B3, B4, B5, B6, B7, and as said third set of inputs an output of said first class decoder and its logical inverse output, an output of said second class decoder and its logical inverse output, and an output of said third class decoder and its logical inverse output.

15. A method of decoding from an input address a first output and a second output in the same memory cycle, comprising the steps of:

providing a burst counter for a Single Data Rate (SDR) memory operation for increasing the starting address by one at each clock rising edge to generate an input address for a column decoder;

providing said burst counter for a Double Data Rate (DDR) memory operation for increasing the starting address 1D3 by two at each clock rising edge to generate said input address for said column decoder;

providing a DDR pre-decoder to function as a "one-address-to-two-locations-selected" pre-decoder activating two adjacent pre-decoder outputs from a set of outputs at the same time;

providing a first and a second pre-decoder to function as "one-address-to-one-location-selected" pre-decoders;

providing a column decoder to decode simultaneously two adjacent or boundary adjacent outputs, equal to two memory locations;

providing an even match circuit for addressing redundant memory columns, said even match circuits selecting one even redundant column, said even match circuit receiving the output of said burst counter; and providing an odd match circuit for addressing redundant memory columns, said odd match circuit selecting one odd redundant column, said odd match circuit receiving said output of said burst counter.

16. The method of claim 15, wherein said DDR memory operation further provides class decoders for determining one of three classes of memory addressing, based on burst type and burst length.

* * * * *